(12) United States Patent
Cao et al.

(10) Patent No.: US 12,322,430 B2
(45) Date of Patent: Jun. 3, 2025

(54) REFRESH CIRCUIT AND MEMORY (71) Applicant: CHANGXIN MEMORY TECHNOLOGIES, INC., Hefei (CN)

(72) Inventors: Xianlei Cao, Hefei (CN); Xian Fan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 200 days.

(21) Appl. No.: 18/331,923

(22) Filed: Jun. 8, 2023

(65) Prior Publication Data

US 2023/0317133 A1    Oct. 5, 2023

Related U.S. Application Data

(63) Continuation of application No. PCT/CN2022/079803, filed on Mar. 8, 2022.

(30) Foreign Application Priority Data

Jan. 14, 2022    (CN) .......................... 202210044510.3

(51) Int. Cl.
*G11C 11/40* (2006.01)
*G11C 11/406* (2006.01)
*G11C 11/408* (2006.01)

(52) U.S. Cl.
CPC ........ *G11C 11/406* (2013.01); *G11C 11/4085* (2013.01)

(58) Field of Classification Search
CPC .. G11C 11/406; G11C 11/4085; G11C 16/105
See application file for complete search history.

(56) References Cited

U.S. PATENT DOCUMENTS 9,478,316 B1 * 10/2016 Ryu ...................... G11C 29/76
2015/0162064 A1    6/2015 Oh et al.
(Continued)

FOREIGN PATENT DOCUMENTS

CN    107025927 A    8/2017
CN    110246535 A    9/2019
(Continued)

OTHER PUBLICATIONS

International Search Report in the international application No. PCT/CN2022/079803, mailed on Oct. 10, 2022.

*Primary Examiner* — Han Yang
(74) *Attorney, Agent, or Firm* — Syncoda LLC; Feng Ma (57) ABSTRACT

A preprocessing module receives a word line activation command and a clock signal and outputs a word line address corresponding to a current word line activation command as a word line address signal when a count value reaches a preset value. An address processing module counts all received word line address signals and outputs a word line address signal with the largest number of occurrences as a row hammer address. A first processing unit generates first and second supplementary refresh address according to the row hammer address. A second processing unit generates a normal refresh address according to a refresh command. A refresh unit performs a refresh operation according to an acquired address signal. A control unit selects to output a refresh address or control the refresh unit to select to receive a refresh address.

16 Claims, 6 Drawing Sheets

(56) References Cited

U.S. PATENT DOCUMENTS

| | | |
|---|---|---|
| 2017/0213586 A1 | 7/2017 | Kang et al. |
| 2019/0279706 A1 | 9/2019 | Kim |
| 2020/0058346 A1 | 2/2020 | Ito et al. |
| 2022/0199148 A1* | 6/2022 | Hong .................. G11C 11/4091 |

FOREIGN PATENT DOCUMENTS

| | | |
|---|---|---|
| CN | 110827884 A | 2/2020 |
| CN | 112767983 A | 5/2021 |
| CN | 112786087 A | 5/2021 |
| CN | 115083467 A | 9/2022 |

\* cited by examiner

REFRESH CIRCUIT AND MEMORY

CROSS-REFERENCE TO RELATED APPLICATIONS

This application is a continuation of International Patent Application No. PCT/CN2022/079803 filed on Mar. 8, 2022, which claims priority to Chinese Patent Application No. 202210044510.3 filed on Jan. 14, 2022. The disclosures of the above-referenced applications are hereby incorporated by reference in their entirety.

BACKGROUND

Dynamic Random Access Memory (DRAM) stores data through memory cells with one transistor-one capacitor (1T1C) structure per cell, where the transistor is controlled by a word line (WL). When the WL is turned on, charges in the memory cell are shared with the charges in a bit line (BL) so as to read data from or write data to a target memory cell.

However, frequent activation or long time activation of word lines will lead to loss of charges in adjacent memory cells, which may lead to errors in the data stored in memory cells.

How to refresh the data in the adjacent memory cells controlled by word lines frequently activated or long-time activated, so as to ensure the accuracy of the data stored in each memory area is a technical problem to be solved urgently.

SUMMARY

The present disclosure relates to the field of semiconductor circuit design, and in particular to a refresh circuit and a memory.

In embodiments of the present disclosure, there is provided a refresh circuit, including: a preprocessing module, an address processing module, a first processing unit, a second processing unit, a refresh unit and a control unit. The preprocessing module is configured to receive a word line activation command and a clock signal, count clock signals in response to the word line activation command, and output a word line address corresponding to a current word line activation command as a word line address signal when a count value of the clock signals reaches a preset value. The address processing module is connected with the preprocessing module, and is configured to count all received word line address signals, and output a word line address signal with a largest number of occurrence times as a row hammer address. The first processing unit is connected with the address processing module, and is configured to generate a first supplementary refresh address and a second supplementary refresh address according to the row hammer address received, where a word line to which the first supplementary refresh address points and a word line to which the second supplementary refresh address points are adjacent to a word line to which the row hammer address points. The second processing unit is configured to generate a normal refresh address according to a refresh command. The refresh unit is connected with the first processing unit and the second processing unit, and is configured to perform a refresh operation according to an acquired address signal. The control unit is connected with the first processing unit and the second processing unit, and is configured to select to output the normal refresh address, the first supplementary refresh address or the second supplementary refresh address; or the control unit is connected with the refresh unit, and is configured to control the refresh unit to select to receive the normal refresh address, the first supplementary refresh address or the second supplementary refresh address.

The embodiments of the present disclosure further provide a memory, which refreshes memory units using the refresh circuit according to the above embodiments.

BRIEF DESCRIPTION OF THE DRAWINGS

Exemplary illustrations are given to one or more embodiments based on figures in the corresponding drawings and do not constitute limitations to the embodiments, and the figures in drawings do not constitute a limitation of scale unless specifically stated. In order to explain more clearly technical solutions of the embodiments of the present disclosure or the conventional art, accompanying drawings required in the embodiments will be briefly introduced below. It will be apparent that the drawings in the following description are merely some embodiments of the present disclosure, and other drawings may be obtained from these drawings without creative work by those of ordinary skill in the art.

DETAILED DESCRIPTION

Frequent activation or long time activation of word lines (WL) will lead to charge loss in adjacent memory cells, which may lead to errors in the data stored in memory cells.

An embodiment of the present disclosure provides a refresh circuit, which realizes acquisition of addresses of word lines activated frequently and activated for a long time, and refreshes the data in the adjacent memory cells for the acquired addresses, so as to ensure the accuracy of data stored in the memory cells.

Those of ordinary skill in the art will appreciate that numerous technical details have been provided in various embodiments of the present disclosure for better understanding of the present disclosure by the reader. However, even without these technical details as well as various changes and modifications based on the following embodiments, the technical solutions claimed in the present disclosure may be realized. The following divisions of the respective embodiments are for convenience of description and should not be limited in any way to the specific implementation of the present disclosure. The various embodiments may be combined and cross-referenced with each other without contradiction.

Figure 1:
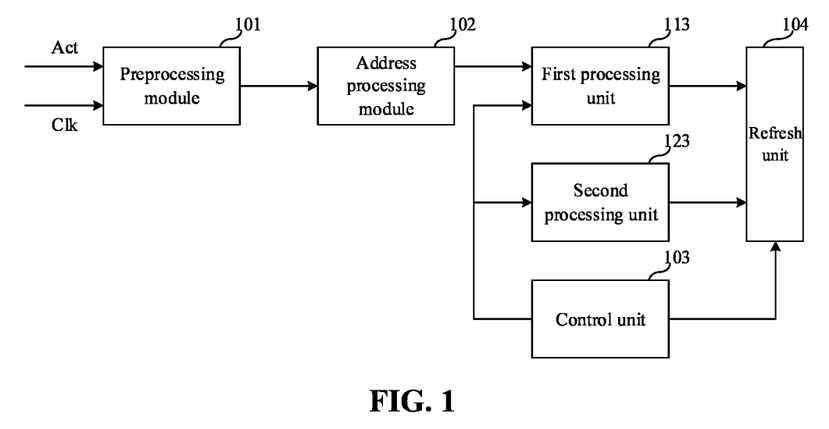
FIG. 1 is a structural diagram of a refresh circuit provided by an embodiment of the present disclosure.
Figure 2:
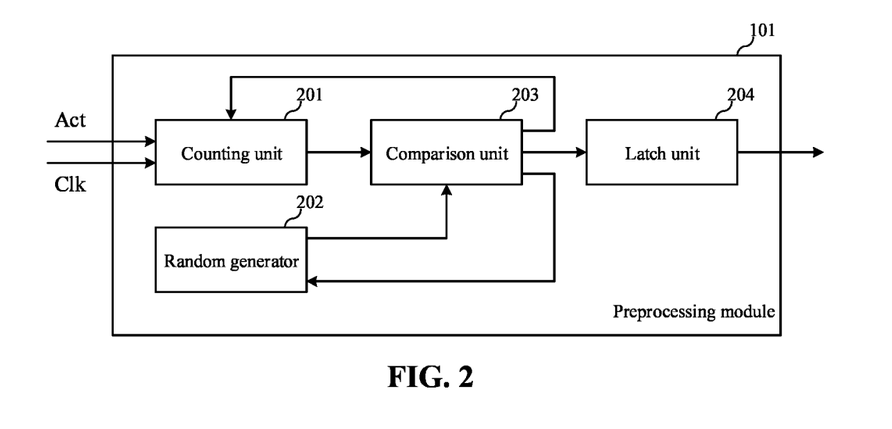
FIG. 2 is a structural diagram of a preprocessing module provided by an embodiment of the present disclosure.
Figure 3:
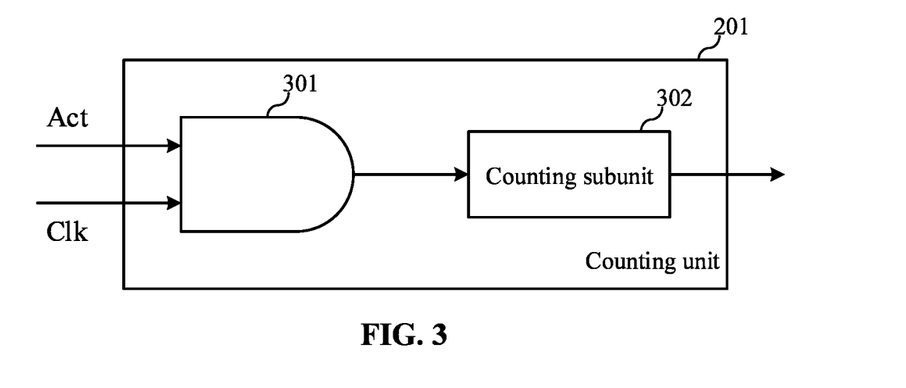
FIG. 3 is a structural diagram of a counting unit provided by an embodiment of the present disclosure.
Figure 4:
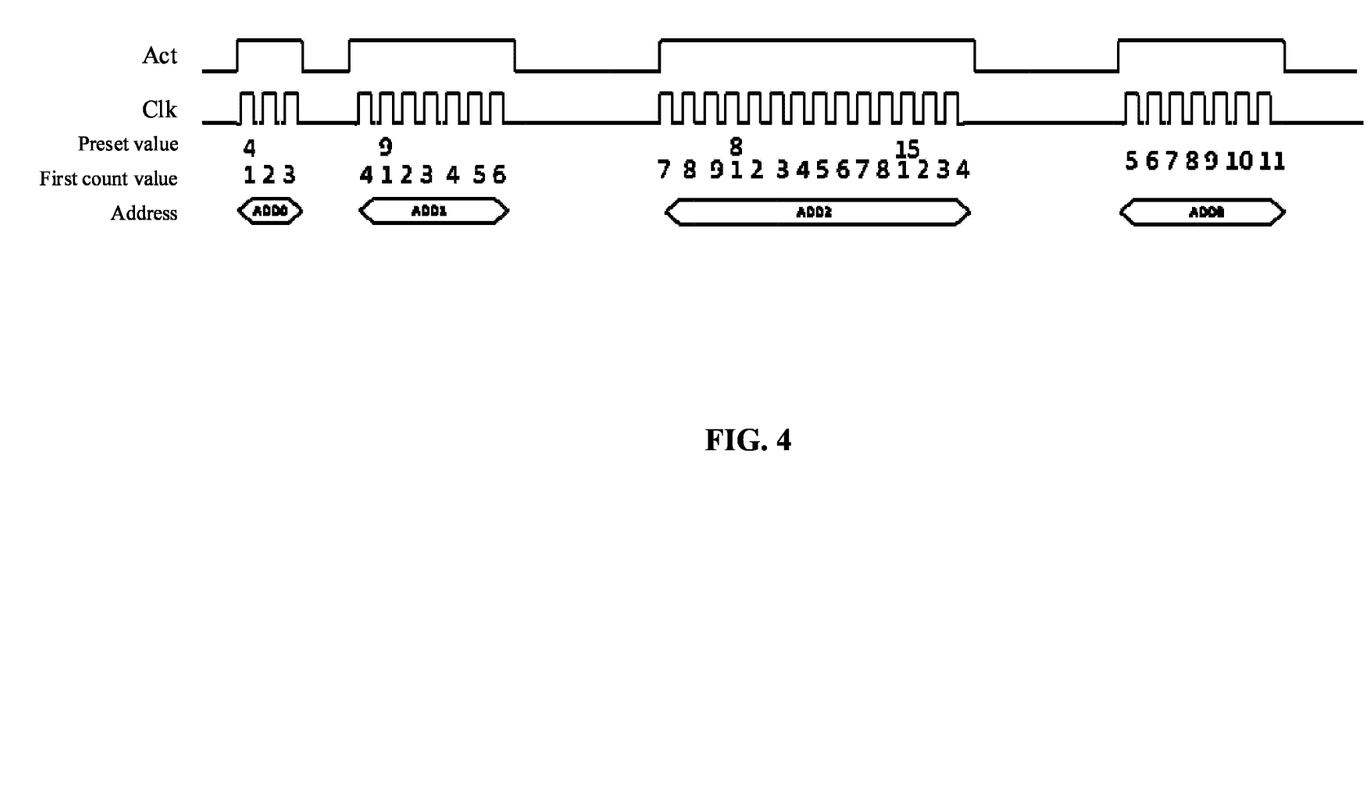
FIG. 4 is a schematic diagram of a counting principle of the preprocessing module provided by an embodiment of the present disclosure.
Figure 5:
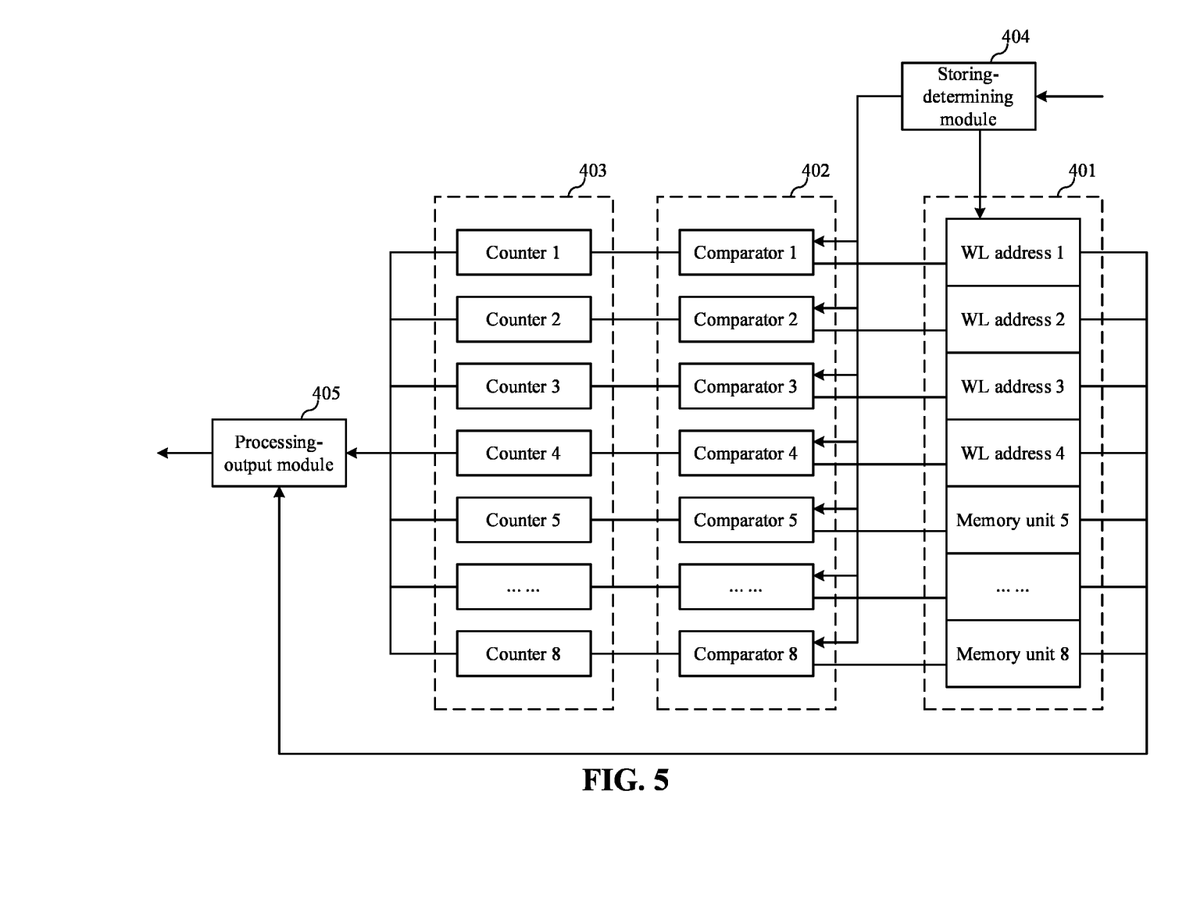
FIG. 5 is a structural diagram of an address processing module provided by an embodiment of the present disclosure.
Figure 6:
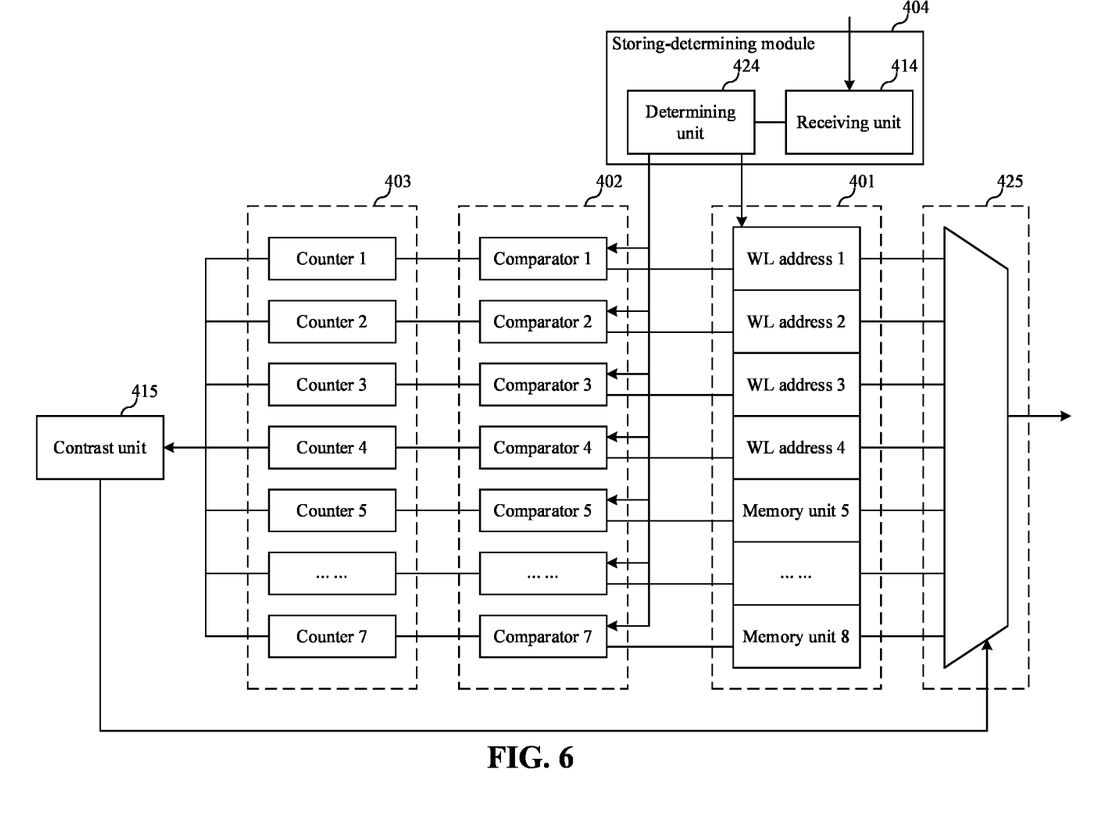
FIG. 6 is a structural diagram of a storing-determining module and a processing-output module provided by an embodiment of the present disclosure.

FIG. 1 is a structural diagram of a refresh circuit provided by an embodiment of the present disclosure, FIG. 2 is a structural diagram of a preprocessing module provided by an embodiment of the present disclosure, FIG. 3 is a structural diagram of a counting unit provided by an embodiment of the present disclosure, FIG. 4 is a schematic diagram of a counting principle of the preprocessing module provided by an embodiment of the present disclosure, FIG. 5 is a structural diagram of an address processing module provided by an embodiment of the present disclosure, and FIG. 6 is a structural diagram of a storing-determining module and a processing-output module provided by an embodiment of the present disclosure. The refresh circuit provided by the embodiments is further explained in detail as follows in combination with the drawings.

Referring to FIG. 1, the refresh circuit includes a preprocessing module 101, an address processing module 102, a first processing unit 113, a second processing unit 123, a refresh unit 104 and a control unit 103.

The preprocessing module 101 is configured to receive a word line activation command Act and a clock signal Clk, count clock signals Clk in response to the word line activation command Act, and output a word line address corresponding to a current word line activation command as a word line address signal when a count value of the clock signals reaches a preset value.

The word line activation command Act is used for activating the word line(s) WL, and the activated word line WL is controlled specifically by the word line address Address corresponding to the word line activation command Act. The counting of clock signals Clk in response to the word line activation command Act means that when both the word line activation command Act and the clock signal Clk are effective levels, the count value of the clock signals is increased by one. Through such arrangement, more count values can be obtained for a word line that has been activated for a long time, thereby increasing a probability that the word line address Address corresponding to the word line that has been activated for a long time is output as a word line address signal.

The address processing module 102 is connected with the preprocessing module 101, and is configured to count all received word line address signals, and output a word line address signal with a largest number of occurrence times as a row hammer address.

The address processing module 102 is configured to output the word line address signal that has many occurrence times, that is, the word line address Address that has been activated many times. In addition, it can be seen from the above that the word line address Address that has been activated for a long time is also input to the address processing module 102 with a high probability. Therefore, the row hammer address output by the address processing module 102 takes into account two situations where the word line WL is activated for many times or activated for a long time.

The first processing unit 113 is connected with the address processing module, and is configured to generate a first supplementary refresh address and a second supplementary refresh address according to the row hammer address received. A word line WL to which the first supplementary refresh address points and a word line WL to which the second supplementary refresh address points are adjacent to a word line WL to which the row hammer address points.

That is, the first supplementary refresh address=the row hammer address+1, the second supplementary refresh address=the row hammer address −1, or the first supplementary refresh address=the row hammer address −1, the second supplementary refresh address=the row hammer address+1.

The second processing unit 123 is configured to generate a normal refresh address according to a refresh command.

The refresh unit 104 is connected with the first processing unit 113 and the second processing unit 123, and is configured to perform a refresh operation according to an acquired address signal.

The address signal acquired by the refresh unit each time 104 is one of the normal refresh address, the first supplementary refresh address, and the second supplementary refresh address. The normal refresh address is a refresh address corresponding to the refresh command.

The control unit 103 is connected with the first processing unit 113 and the second processing unit 123, and is configured to select to output the normal refresh address, the first supplementary refresh address or the second supplementary refresh address; or the control unit 103 is connected with the refresh unit 104, and is configured to control the refresh unit 104 to select to receive the normal refresh address, the first supplementary refresh address or the second supplementary refresh address.

Specifically, the control unit 103 is configured to: output the normal refresh address in response to that the second processing unit 123 generates the normal refresh address; and output the first supplementary refresh address and the second supplementary refresh address after the refresh unit 104 completes refresh of the normal refresh address.

In an example, the control unit 103 may control the first processing unit 113 to output the first supplementary refresh address and the second supplementary refresh address or control the second processing unit 123 to output the normal refresh address by connecting with the first processing unit 113 and the second processing unit 123.

In another example, the control unit 103 may also select to receive the normal refresh address, the first supplementary refresh address or the second supplementary refresh address by connecting with the refresh unit 104. When the refresh command is received, the control unit 103 controls input of the normal refresh address to the refresh unit 104 for refreshing the normal refresh address. After the refresh of the normal refresh address by the refresh unit 104 is completed, the control unit 103 controls input of the first supplementary refresh address and the second supplementary refresh address to the refresh unit 104, and the refresh unit 104 refreshes based on the first supplementary refresh address and the second supplementary refresh address, so as to prevent the loss of charges in adjacent memory cells caused by frequent activated or long-time activated word lines WL and avoid causing errors in the data stored in the memory cells.

To sum up, the preprocessing module 101 counts the clock signal Clk upon reception of the word line activation commands Act to increase the probability that the word line address Address corresponding to the word line that has been activated for a long time is output as the word line address signal. The address processing module 102 counts the word line address signal with the largest number of occurrence times, so that the row hammer address output by the address processing module 102 takes into account two situations where the word line WL is activated for many times or activated for a long time. When the refresh command is received, the control unit 103 controls input of the normal refresh address to the refresh unit 104 for refreshing the normal refresh address. After the refresh of the normal refresh address by the refresh unit 104 is completed, the control unit 103 controls input of the first supplementary refresh address and the second supplementary refresh address to the refresh unit 104, and the refresh unit 104 refreshes based on the first supplementary refresh address and the second supplementary refresh address, so as to prevent the loss of charges in adjacent memory cells caused by frequent activated or long-time activated the word line WL and avoid causing errors in the data stored in the memory cells.

It should be noted that in some embodiments, the control unit 103 may also first output the first supplementary refresh address and the second supplementary refresh address, and then output the normal refresh address. That is, the memory first completes the refresh of the first supplementary refresh address and the second supplementary refresh address based on the refresh command, and then refreshes the normal refresh address.

In some embodiments, referring to FIG. 2, the preprocessing module 101 includes a counting unit 201, a comparison unit 203 and a latch unit 204.

The counting unit 201 is configured to receive the word line activation command Act and the clock signal Clk, store a first count value, and control the first count value to increase by one when the word line activation command Act and a clock signal Clk are received simultaneously.

The comparison unit 203 is connected with the counting unit 201, and is configured to generate a latch signal when the first count value is equal to the preset value.

The latch unit 204 is connected with the comparison unit 203, and is configured to receive a word line address Address corresponding to the word line activation command Act and output, based on the latch signal, the word line address Address corresponding to the current word line activation command as the word line address signal.

In response to that the latch unit outputs the word line address signal, the counting unit 201 resets the first count value.

The counting unit 201 obtains the number of times when both the word line activation command Act and the clock signal Clk are effective levels based on the first count value. The comparison unit 203 is configured to compare the first count value with a pre-stored preset value, and output a latch signal when the first count value is equal to the preset value. The latch unit 204 outputs the word line address Address corresponding to the current word line activation command Act based on the latch signal. In this way, the probability that the word line address Address corresponding to the word line that has been activated for a long time is output as the word line address signal is increased.

It should be noted that in the embodiments, the counting unit 201 adopts addition counting, that is, it may be considered that an addition counter is embedded in the counting unit 201. An initial value of the first count value is 0, and the first count value gradually approaches the preset value through the addition counting to output the word line address signal. In addition, in some embodiments, the counting unit 201 may also adopt subtraction counting, that is, it may be considered that a subtraction counter is embedded in the counting unit 201. The initial value of the first count value is larger than the preset value, and the first count value gradually approaches the preset value through the subtraction counting to output the word line address signal.

In some embodiments, the comparison unit 203 generates the latch signal and a reset signal simultaneously when the first count value is equal to the preset value, and the counting unit 201 resets the first count value as 0 based on the reset signal to realize multiple outputs of the word line address signal by the preprocessing module.

In addition, if the counting unit 201 adopts the subtraction counting, the comparison unit 203 generates the latch signal and a reset signal simultaneously when the first count value is equal to the preset value. The counting unit 201 resets the first count value to an initial value based on the reset signal, and the initial value is greater than the preset value.

In some embodiments, the preprocessing module further includes a random generator 202, which is connected with the comparison unit 203 and is configured to generate a random number. The comparison unit 203 is configured to take the random number generated by the random generator 202 as the preset value. The random number generated by the random generator 202 is used as the preset value for the comparison unit 203, which avoids human interference and improves the accuracy of data acquisition.

In some embodiments, the random generator generates a new random number when the latch unit 204 outputs the word line address signal, which improves the randomness of the data and further improves the accuracy of data acquisition.

Specifically, the comparison unit generates the latch signal and a reset signal simultaneously when the first count value is equal to the preset value, and the random generator generates the new random number based on the reset signal.

It should be noted that if the counting unit 201 adopts the subtractive counting, the generated random number needs to be smaller than the initial value of the first count value.

In some embodiments, the random number generated by the random generator ranges from 4 to 15, specifically 4, 5, 6, 7, 8, 9, 10, 11, 12, 13 or 14. When the random number generated by the random generator 202 is less than 4, a sampling interval of data is too small, and the acquired sample data is too large, which increases the burden of the subsequent address processing module and thus requires more circuit area and processing time. When the random number generated by the random generator is greater than 15, the sampling interval of data may be too large, which makes the data acquisition not representative and accurate. In some embodiments, referring to FIG. 3, the counting unit 201 includes an AND gate 301 and a counting subunit 302.

The AND gate 301 has an input terminal configured to receive the clock signal Clk, an input terminal configured to receive the word line activation command Act, and an output terminal connected with the counting subunit 302. The AND gate is configured to generate the control signal when the clock signal Clk and the word line activation command Act are received simultaneously.

The counting subunit 302 is configured to store the first count value and control the first count value to increase by one based on the control signal.

Specifically, referring to FIG. 4, for the preprocessing module 101, when the word line activation command Act is received, the AND gate 301 generates a control signal based on the clock signal Clk, and the counting subunit 302 controls the first count value to increase by one based on the control signal, that is, when the word line activation command Act is effective, the preprocessing module 101 controls the first count value to increase by one according to the clock signal Clk. When the preset value is "4", after the first count value is accumulated to "4", the preprocessing module 101 outputs a corresponding address ADD1. After outputting the address ADD1, the preprocessing module 101 resets the first count value and the preset value, the reset preset value is "9", and a corresponding address ADD2 is output when the first count value is accumulated to "9". After outputting the address ADD2, the preprocessing module 101 resets the first count value and the preset value, the reset preset value is "8", and the corresponding address ADD2 is output when the first count value is accumulated to "8". After outputting the address ADD2, the preprocessing module 101 resets the first count value and the preset value, and the reset preset value is "15". Based on the same principle, the preprocessing module 101 continuously outputs the word line address signal.

In some embodiments, the clock signal Clk is an internal clock signal of a memory of the refresh circuit. The internal clock signal of the memory is used as the count signal of the counting subunit 302, which simplifies the circuit and saves the cost.

In some implementations, the counting unit 201 further includes a clock signal generating unit, which is connected to the AND gate 301 and is configured to generate the clock signal. By additionally providing the clock signal generating unit, a counting interval of the counting subunit 302 can be customized to achieve more accurate counting.

In a particular implementation, the clock signal generating unit may be a ring oscillator, and a period of the generated clock signal may be determined by the number of inverters connected in the ring oscillator.

In some embodiments, referring to FIG. 5, the address processing module 102 includes a plurality of memory units 401, a plurality of comparators 402 and a plurality of counters 403, Each of the memory units 401 is configured to store a word line address, and each of the memory units 401 corresponds to one of the comparators 402 and one of the counters 403.

FIG. 5 exemplarily illustrates eight memory units 401, eight comparators 402, and eight counters 403, which does not constitute a limitation to the embodiments of the present disclosure. In other embodiments, the number of memory units, comparators, and counters may be set according to the specific scenario of the application.

The memory unit n is correspondingly connected with the comparator n and the counter n, where n is a natural number greater than or equal to 1 and less than or equal to 8. Word line address 1 is stored in memory unit 1, word line address 2 is stored in memory unit 2, word line address 3 is stored in memory unit 3, word line address 4 is stored in memory unit 4, and memory unit 5 and subsequent memory units do not store word line addresses, that is, they are empty memory units.

In some embodiments, as illustrated in FIG. 5, the address processing module 102 further includes a storing-determining module 404 and a processing-output module 405.

The storing-determining module 404 is configured to receive the word line address signals, and is configured to: compare sequentially, through the comparators 402 corresponding to the memory units 401 that store word line address signals, whether each of the word line address signals stored in the memory units is the same as an activated word line address signal; in response to that there is a memory unit 401 which stores a same word line address signal as the activated word line address signal, indicate a count value of a counter 403 corresponding to the memory unit 401 that stores the same word line address signal to increase by one; in response to that there is no memory unit 401 which stores the same word line address signal as the activated word line address signal, store the activated word line address signal in a memory unit 401 where a word line address signal is not written.

Corresponding to FIG. 5, it is assumed that the storing-determining module 404 receives a word line address signal, and the memory units 401, i.e., memory units 1, 2, 3, 4 store the word line addresses, and comparators 1, 2, 3, 4 corresponding to the memory units 1, 2 3, 4 respectively compare each of the word line addresses in the memory units 1, 2, 3, 4 with the received word line address signal of the storing-determining module 404. If there is a word line address same as the received word line address signal, it is proved that the current word line address signal has been stored in a memory unit 401, and a count value of a counter 403 corresponding to the comparator 402 that is connected to the memory unit 401 is increased by one. If each of the word line addresses is different from the received word line address signal, it is proved that the current word line address signal is not stored in the memory units 401. Then, the current word line address signal is stored in a new memory unit.

The memory units 401 are connected to comparators 402 for comparing whether a current word line address signal is stored in the memory units 401, and store a word line address signal that is not stored through a memory unit 401. The memory units 401 are connected to counters 403 for counting the word line address signals acquired for many times.

It should be noted that in an example, an initial value of each of the counters 403 is 1, that is, after a memory unit 401 stores data, the counter 403 indicates that the word line address stored in the memory unit 401 is activated once. In other embodiments, it only needs to satisfy that the initial values of the counters are all the same, and the specific initial value may be any arbitrary value.

The processing-output module 405 is configured to output, based on the comparison among count values of the counters 403, a word line address signal stored in a memory unit 401 corresponding to a counter 403 with a largest value.

It should be noted that in the present embodiment, the counter 403 counted in a incremental manner, and then comparison is performed to output the word line address stored in memory unit 401 corresponding to counter 403 with the largest value, that is, the word line address that has been activated the most times. In other embodiments, the counters may also be counted in a decremented manner, and then comparison is performed to output the word line address stored in memory unit 401 corresponding to counter 403 with the smallest value, that is, the word line address that has been activated the most times.

In some embodiments, referring to FIG. 6, the storing-determining module 404 includes: a receiving unit 414 and a determining unit 424. The receiving unit 414 is configured to receive the word line address signals. The determining unit 424 is connected with the receiving unit 414, the plurality of memory units 401 and the plurality of comparators 402 corresponding to the plurality of memory units 401. In response to that there is a memory unit 401 which stores the same word line address signal as the current word line address signal, the determining unit 424 indicates that the count value of the counter 403 corresponding to the memory unit 401 to increase by one; and in response to that there is no memory unit 401 which stores the same word line address signal as the current word line address signal, the determining unit 424 stores the current word line address signal in a memory unit 401 where the word line address signal is not written.

Specifically, in an example, the operation that in response to that there is the memory unit 401 which stores the same word line address signal as the current word line address signal, the determining unit 424 indicates that the count value of the counter 403 corresponding to the memory unit 401 to increase by one; and in response to that there is no memory unit 401 which stores the same word line address signal as the current word line address signal, the determining unit 424 stores the current word line address signal in the memory unit 401 where the word line address signal is not written is implemented as follows.

In response to that there is the memory unit 401 which stores the same word line address signal as the current word line address signal, the determining unit 124 generates a first control signal and a second control signal; and a counter 403 corresponding to a memory unit 401 storing the current word line address signal increases its count value by one based on the first control signal. The second control signal is used to indicate to prevent the current word line address signal from being stored in the memory unit 401.

If the comparators 402 corresponding to the memory units 401 storing the word line address signal do not generate the first control signal and the second control signal, it indicates that the current word line address signal is not stored in any of the memory units 401, and then the current word line address signal is stored in a memory unit 401.

In some embodiments, the processing-output module 405 includes: a contrast unit 415 and an output unit 425. The contrast unit 415 is connected with the plurality of counters 403 corresponding to the plurality of memory units 401, and is configured to compare count values of the plurality of counters 403 and output data of a counter with the largest count value. The output unit 405 is connected with the contrast unit 415 and the plurality of the memory units 401, and is configured to output the word line address signal stored in the memory unit 401 corresponding the counter according to the data of the counter.

In the embodiments of the present disclosure, the preprocessing module 101 counts the clock signal Clk when the word line activation command Act is received to increase the probability that the word line address Address corresponding to the long-time activated word line is output as the word line address signal; and the address processing module 102 counts a word line address signal with the largest number of occurrence times, so that the row hammer address output by the address processing module 102 takes into account two situations where the word line WL is activated for many times or activated for a long time. When the refresh command is received, the control unit 103 controls input of the normal refresh address to the refresh unit 104 for refreshing the normal refresh address. After the refresh of the normal refresh address is completed by the refresh unit 104, the control unit 103 controls input of the first supplementary refresh address and the second supplementary refresh address to the refresh unit 104, and the refresh unit 104 refreshes based on the first supplementary refresh address and the second supplementary refresh address, so as to prevent the loss of charges in adjacent memory cells caused by frequent activated or long-time activated word line WL and avoid causing errors in the data stored in the memory cells.

It should be noted that the disclosed features in the refresh circuit provided by the above embodiments can be arbitrarily combined without conflict, and a new embodiment of refresh circuit can be obtained. It is to be understood that the various modules included in the refresh circuit may be implemented as circuit or sub-circuit, for example, the preprocessing module is preprocessing circuit/sub-circuit, the address processing module is address processing circuit/sub-circuit, the processing unit is processing circuit/sub-circuit, etc.

Another embodiment of the present disclosure provides a memory, which refreshes memory cells in the memory using the refresh circuit provided by the above embodiments, thereby realizing acquisition of addresses of word lines activated frequently and activated for a long time, and refreshes the data in the adjacent memory cells for the acquired addresses, so as to ensure the accuracy of data stored in the memory cells.

In some embodiments, the memory is a DRAM chip, and the memory of the DRAM chip conforms to the DDR2 memory specification.

In some embodiments, the memory is a DRAM chip, and the memory of the DRAM chip conforms to the DDR3 memory specification.

In some embodiments, the memory is a DRAM chip, and the memory of the DRAM chip conforms to the DDR4 memory specification.

In some embodiments, the memory is a DRAM chip, and the memory of the DRAM chip conforms to the DDR5 memory specification.

Those of ordinary skill in the art will appreciate that the above-described embodiments are specific embodiments for carrying out the present disclosure, and in practical application, various, changes in form and detail may be made thereto without departing from the spirit and scope of the present disclosure.

What is claimed is:

1. A refresh circuit, comprising:
a preprocessing module, configured to receive a word line activation command and a clock signal, count clock signals in response to the word line activation command, and output a word line address corresponding to a current word line activation command as a word line address signal when a count value of the clock signals reaches a preset value;
an address processing module, connected with the preprocessing module, and configured to count all received word line address signals, and output a word line address signal with a largest number of occurrence times as a row hammer address;
a first processing unit, connected with the address processing module, and configured to generate a first supplementary refresh address and a second supplementary refresh address according to the row hammer address received, wherein a word line to which the first supplementary refresh address points and a word line to which the second supplementary refresh address points are adjacent to a word line to which the row hammer address points;
a second processing unit, configured to generate a normal refresh address according to a refresh command;
a refresh unit, connected with the first processing unit and the second processing unit, and configured to perform a refresh operation according to an acquired address signal; and
a control unit, connected with the first processing unit and the second processing unit, and configured to select to output the normal refresh address, the first supplementary refresh address or the second supplementary refresh address; or connected with the refresh unit, and configured to control the refresh unit to select to receive the normal refresh address, the first supplementary refresh address or the second supplementary refresh address.

2. The refresh circuit of claim 1, wherein the preprocessing module comprises:
a counting unit, configured to receive the word line activation command and the clock signal, store a first count value, and control the first count value to increase by one when the word line activation command and a clock signal are received simultaneously;

a comparison unit, connected with the counting unit, and configured to generate a latch signal when the first count value is equal to the preset value; and a latch unit, connected with the comparison unit, and configured to receive a word line address corresponding to the word line activation command and output, based on the latch signal, the word line address corresponding to the current word line activation command as the word line address signal;

wherein in response to that the latch unit outputs the word line address signal, the counting unit resets the first count value.

3. The refresh circuit of claim 2, wherein the comparison unit generates the latch signal and a reset signal simultaneously when the first count value is equal to the preset value, and the counting unit resets the first count value as 0 based on the reset signal.

4. The refresh circuit of claim 2, wherein the preprocessing module further comprises: a random generator, connected with the comparison unit and configured to generate a random number, and wherein the comparison unit is configured to take the random number generated by the random generator as the preset value.

5. The refresh circuit of claim 4, wherein the random generator generates a new random number when the latch unit outputs the word line address signal.

6. The refresh circuit of claim 5, wherein the comparison unit generates the latch signal and a reset signal simultaneously when the first count value is equal to the preset value, and the random generator generates the new random number based on the reset signal.

7. The refresh circuit of claim 4, wherein the random number generated by the random generator ranges from 4 to 15.

8. The refresh circuit of claim 2, wherein the counting unit comprises:

an AND gate, having an input terminal configured to receive the clock signal, an input terminal configured to receive the word line activation command, and an output terminal connected with a counting subunit, the AND gate being configured to generate a control signal when the clock signal and the word line activation command are received simultaneously; and the counting subunit, configured to store the first count value and control the first count value to increase by one based on the control signal.

9. The refresh circuit of claim 8, wherein the clock signal is an internal clock signal of a memory to which the refresh circuit belongs.

10. The refresh circuit of claim 8, wherein the counting unit further comprises: a clock signal generating unit, connected to the AND gate and configured to generate the clock signal.

11. The refresh circuit of claim 1, wherein the control unit is configured to:

in response to that the second processing unit generates the normal refresh address, output the normal refresh address; and in response to that the refresh unit completes refresh of the normal refresh address, output the first supplementary refresh address and the second supplementary refresh address.

12. The refresh circuit of claim 1, wherein the address processing module comprises:

a plurality of memory units, a plurality of comparators and a plurality of counters, wherein each of the memory units is configured to store a word line address signal, and each of the memory units corresponds to one of the comparators and one of the counters;

a storing-determining module, configured to receive the word line address signals, and configured to: compare sequentially, through comparators corresponding to memory units which have stored word line address signals, whether each of the word line address signals stored in the memory units is the same as a current word line address signal; in response to that there is a memory unit which stores a same word line address signal as the current word line address signal, indicate a count value of a counter corresponding to the memory unit to increase by one; in response to that there is no memory unit which stores the same word line address signal as the current word line address signal, store the current word line address signal in a memory unit where a word line address signal is not written; and a processing-output module, configured to output, based on the comparison among count values of the counters, a word line address signal stored in a memory unit corresponding to a counter with a largest count value.

13. The refresh circuit of claim 12, wherein the storing-determining module comprises:

a receiving unit, configured to receive the word line address signals; and a determining unit, connected with the receiving unit, the plurality of memory units and the plurality of comparators corresponding to the plurality of memory units;

wherein in response to that there is the memory unit which stores the same word line address signal as the current word line address signal, the determining unit indicates that the count value of the counter corresponding to the memory unit to increase by one; in response to that there is no memory unit which stores the same word line address signal as the current word line address signal, the determining unit stores the current word line address signal in the memory unit where the word line address signal is not written.

14. The refresh circuit of claim 13, wherein in response to that there is the memory unit which stores the same word line address signal as the current word line address signal, the determining unit indicating that the count value of the counter corresponding to the memory unit to increase by one comprises that:

in response to that there is the memory unit which stores the same word line address signal as the current word line address signal, the determining unit generates a first control signal and a second control signal; and a counter corresponding to a memory unit storing the current word line address signal increases the count value by one based on the first control signal;

wherein the second control signal is used to indicate to prevent the current word line address signal from being stored in the memory unit.

15. The refresh circuit of claim 12, wherein the processing-output module comprises:

a contrast unit, connected with the plurality of counters corresponding to the plurality of memory units, and configured to compare count values of the plurality of counters and output data of the counter with the largest count value; and an output unit, connected with the contrast unit and the plurality of the memory units, and configured to output, according to the data of the counter, the word line address signal stored in the memory unit corresponding the counter.

16. A memory, configured to refresh memory cells using the refresh circuit of claim 1.

* * * * *